(12) United States Patent
Lei et al.

(10) Patent No.: US 8,932,939 B1
(45) Date of Patent: Jan. 13, 2015

(54) WATER SOLUBLE MASK FORMATION BY DRY FILM LAMINATION

(71) Applicants: Wei-Sheng Lei, San Jose, CA (US);
James S. Papanu, San Rafael, CA (US);
Brad Eaton, Menlo Park, CA (US);
Ajay Kumar, Cupertino, CA (US)

(72) Inventors: Wei-Sheng Lei, San Jose, CA (US);
James S. Papanu, San Rafael, CA (US);
Brad Eaton, Menlo Park, CA (US);
Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/252,597

(22) Filed: Apr. 14, 2014

(51) Int. Cl.
*H01L 21/00* (2006.01)
*H01L 21/683* (2006.01)
*H01L 21/78* (2006.01)

(52) U.S. Cl.
CPC .......... *H01L 21/6836* (2013.01); *H01L 21/78* (2013.01)
USPC .......................................... 438/462; 438/463

(58) Field of Classification Search
CPC .............. H01L 21/6836; H01L 2221/68327; H01L 21/3081; H01L 21/3086; H01L 21/67069; H01L 21/67132; H01L 2221/68318; H01L 2224/2929; H01L 21/027; H01L 21/0271; H01L 21/308
USPC .................................................. 438/462, 463
See application file for complete search history.

(56) References Cited

U.S. PATENT DOCUMENTS

| | | | |
|---|---|---|---|
| 4,049,944 A | 9/1977 | Garvin et al. | |
| 4,983,248 A * | 1/1991 | Seki | 156/497 |
| 5,112,428 A * | 5/1992 | Correa et al. | 156/324 |
| 5,372,670 A | 12/1994 | Cummings et al. | |
| 5,593,606 A | 1/1997 | Owen et al. | |
| 6,057,180 A | 5/2000 | Sun et al. | |
| 6,174,271 B1 | 1/2001 | Kosmowski | |
| 6,306,731 B1 | 10/2001 | Igarashi et al. | |
| 6,407,363 B2 | 6/2002 | Dunsky et al. | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Bac Au
(74) *Attorney, Agent, or Firm* — Blakely Sokoloff Taylor Zafman LLP

(57) ABSTRACT

Methods and systems for forming water soluble masks by dry film lamination are described. Also described are methods of wafer dicing, including formation of a water soluble mask by dry film lamination. In one embodiment, a method involves moisturizing an inner area of a water soluble dry film. The method involves stretching the water soluble dry film over a surface of the semiconductor wafer, and attaching the moistened inner area of the stretched film to the surface of the semiconductor wafer. A method of wafer dicing may further involve patterning the water soluble dry film, exposing regions of the semiconductor wafer between the ICs, and etching the semiconductor wafer through gaps in the patterned water soluble dry film.

20 Claims, 14 Drawing Sheets

(56) References Cited

U.S. PATENT DOCUMENTS

| | | | |
|---|---|---|---|
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,927,973 | B2 | 4/2011 | Haji et al. |
| 8,524,537 | B2 * | 9/2013 | Yun et al. ............... 438/114 |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2006/0043535 | A1 | 3/2006 | Hiatt |
| 2006/0205182 | A1 | 9/2006 | Soejima |
| 2007/0252887 | A1 * | 11/2007 | Mizuhara et al. ........... 347/212 |
| 2009/0255911 | A1 | 10/2009 | Krishnaswami et al. |
| 2011/0312157 | A1 | 12/2011 | Lei et al. |
| 2012/0322233 | A1 * | 12/2012 | Lei et al. ............... 438/462 |
| 2012/0322241 | A1 * | 12/2012 | Holden et al. ............ 438/462 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

* cited by examiner

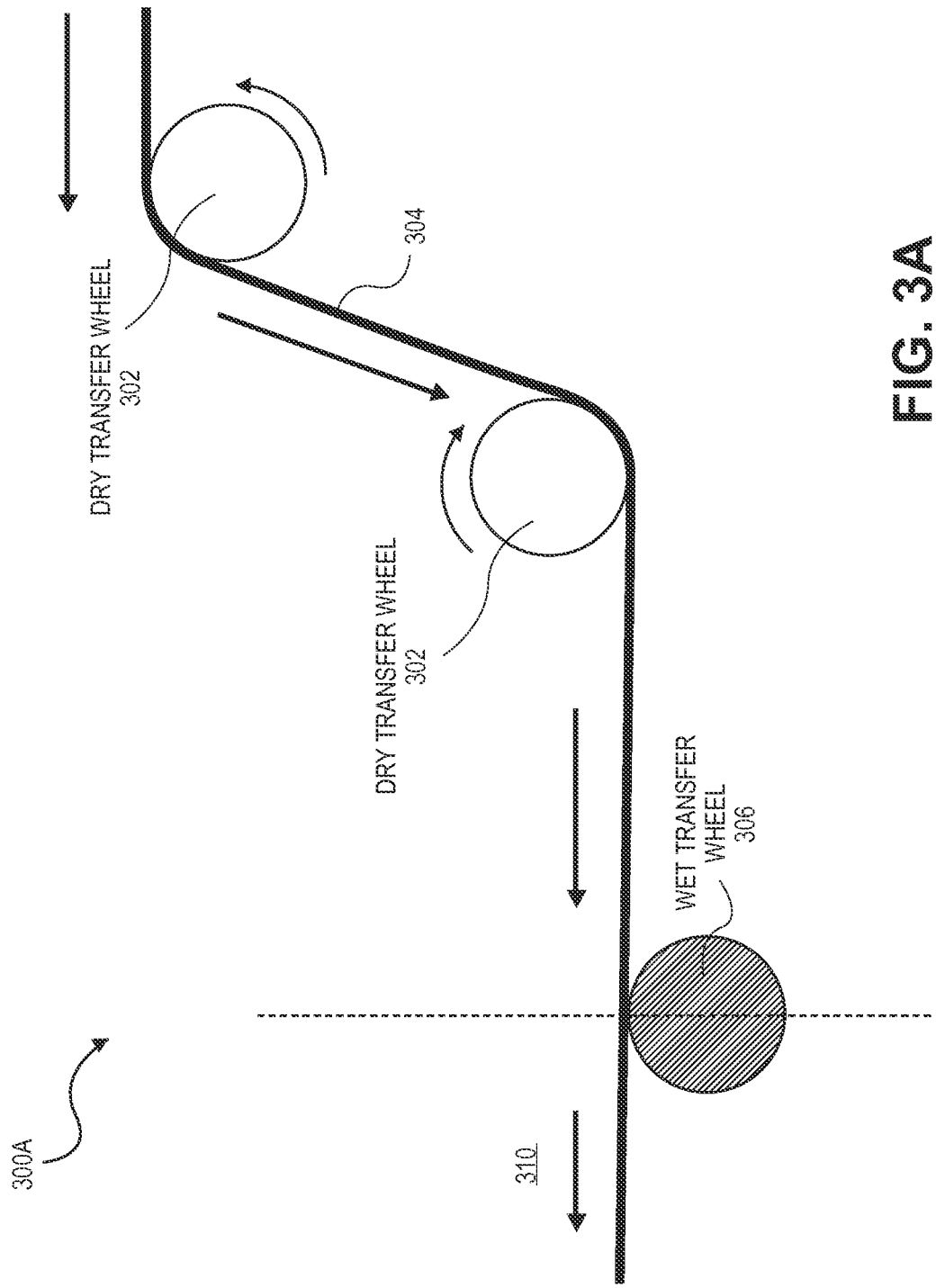

US 8,932,939 B1

WATER SOLUBLE MASK FORMATION BY DRY FILM LAMINATION

BACKGROUND

1) Field

Embodiments of the present invention pertain to the field of semiconductor processing and, in particular, to methods of water soluble mask formation by dry film lamination.

2) Description of Related Art

In semiconductor wafer processing, integrated circuits are formed on a wafer (also referred to as a substrate) composed of silicon or other semiconductor material. In general, layers of various materials which are either semiconducting, conducting, or insulating are utilized to form the integrated circuits. These materials are doped, deposited, and etched using various well-known processes to form integrated circuits. Each wafer is processed to form a large number of individual regions containing integrated circuits known as dice or dies.

Forming and dicing the integrated circuits may involve formation of a mask layer. Conventionally, a mask layer may be formed by techniques such as spin-coating or screen printing. However, such methods may result in voids or air bubbles due to the high viscosity of the mask material, which may result in a defective mask that fails to provide sufficient protection from subsequent processing.

Other conventional methods of forming a mask involve applying a UV-curable resin sheet directly onto the wafer surface. After subsequent processing (e.g., laser and/or plasma processing), the mask is then cured and a tape is attached to the UV-cured mask to remove the UV-cured mask from the wafer. However, such methods may be disadvantageous because the UV-curable mask material can be difficult to remove from the wafer surface after processing. Additionally, if such a UV-curable mask is applied to an underlying polymeric material (e.g., a dry film underfill layer), subsequent processing may result in melting and re-solidifying of the two layers at the kerf edge, making the layers difficult to separate.

SUMMARY

One or more embodiments of the invention are directed to formation of a water soluble mask by dry film lamination.

According to one embodiment, a method of forming a water soluble film over a semiconductor wafer involves moisturizing an inner area of a water soluble dry film. The method involves stretching the water soluble dry film over a surface of the semiconductor wafer, and attaching the moistened inner area of the stretched film to the surface of the semiconductor wafer.

In one embodiment, a dry lamination tool for forming a film over a semiconductor wafer includes a stage configured to support the semiconductor wafer, which is coupled to a frame in a vacuum chamber. The tool includes rollers configured to transfer a water soluble dry film from a film source to the vacuum chamber. The tool includes a moisture applicator configured to moisturize an inner area of the water soluble dry film, and a film applicator configured to apply the moistened inner area of the film to a surface of the semiconductor wafer.

One or more embodiments of the invention are directed to methods of dicing semiconductor wafers, including formation of a water soluble mask by dry film lamination.

According to one embodiment, a method of dicing a semiconductor wafer involves moisturizing an inner area of a water soluble dry film and applying the moistened inner area of the film over a surface of the semiconductor wafer. The method also involves patterning the water soluble dry film, exposing regions of the semiconductor wafer between the ICs. The method further involves etching the semiconductor wafer through gaps in the patterned water soluble dry film.

In one embodiment, a system for dicing a semiconductor wafer includes a dry lamination module. The dry lamination module includes a moisture applicator configured to moisturize an inner area of the water soluble dry film, and a film applicator configured to apply the moistened inner area of the film to a surface of the semiconductor wafer. The dicing system also includes a laser scribe module configured to pattern, with a laser scribe process, the dry film to form a trench exposing regions of the substrate between the ICs. The system also includes a plasma etch module physically coupled to the laser scribe module and configured to etch the substrate to advance the trench through the substrate.

BRIEF DESCRIPTION OF THE DRAWINGS

Embodiments of the present invention are illustrated by way of example, and not by way of limitation, and can be more fully understood with reference to the following detailed description when considered in connection with the figures in which:

FIGS. 3A, 3B, and 3C illustrate cross-sectional views of dry lamination tools, in accordance with embodiments of the present invention;

DETAILED DESCRIPTION

Figure 1:
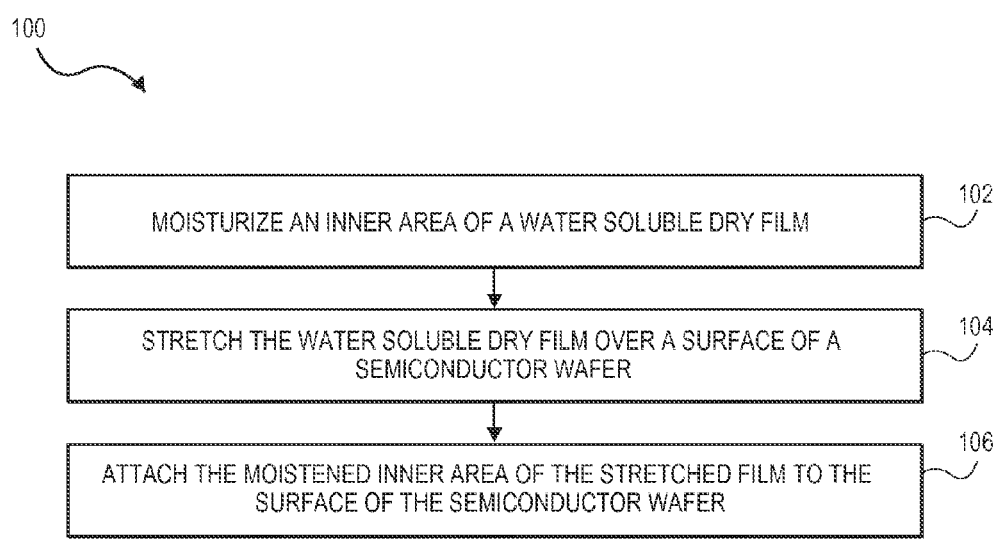
FIG. 1 is a flowchart representing operations in a method of forming a water-soluble film over a semiconductor wafer, in accordance with embodiments of the present invention.

Methods of forming a water soluble mask by dry film lamination are described herein. Also, methods of dicing semiconductor wafers, including formation of a water soluble mask by dry film lamination, are described. In the following description, numerous specific details are set forth, such as laser and plasma etch wafer dicing approaches, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

According to embodiments of the invention, a water soluble film is formed over the wafer surface with a dry lamination technique. The water soluble film may be used to protect integrated circuits from subsequent processing (e.g., laser and/or plasma processing, such as in the wafer dicing method described below). In contrast to existing techniques that involve spin-coating and screen-printing, embodiments using dry lamination enable water soluble film formation with minimal air bubble or void formation.

A water soluble mask formed over a wafer using dry lamination techniques may initially adhere to the wafer, a frame supporting the wafer, and/or adhesive tape coupling the wafer to a wafer frame. However, subsequent processing may result in the mask prematurely separating from the wafer. For example, because typical water soluble films are not adhesive when they are dry, the water soluble film may peel off from the frame supporting the wafer when cutting the film along the frame after dry lamination. Additionally, the water soluble film may initially adhere to the wafer surface due to, in part, good adhesion to the adhesive tape, which results in the mask applying a force across the edges of the wafer. However, subsequent laser or plasma processing may result in the mask separating from the wafer. To address this problem, an adhesive layer could be used to adhere the water soluble film to the wafer surface. However, removal of such an adhesive level after laser or plasma processing can be difficult.

According to embodiments of the invention, a surface of the water soluble dry film is gently moisturized, resulting in the moistened surface becoming adhesive. Moisturizing the water soluble dry film may involve moisturizing the wafer surface. For example, prior to dry lamination, the wafer may be stored in a humid enclosure. Then, when the water soluble dry film comes in contact with the moistened wafer, the water soluble dry film adheres strongly to the wafer. Although desired level of adhesion may be achieved in such an embodiment, it may be difficult to selectively limit the areas of the wafer and frame that become wet. For example, it may be desirable to moisten only part of the frame supporting the wafer, but storing the wafer-on-frame in a humid enclosure will cause the entire frame to become moist.

Figure 2A:
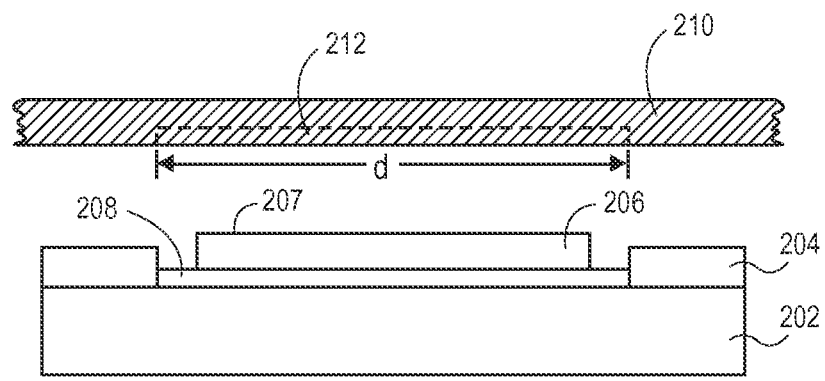
FIGS. 2A and 2B illustrate cross-sectional views of a semiconductor wafer during performance of a method of forming a water-soluble film over a semiconductor wafer, corresponding to operations of FIG. 1, in accordance with an embodiment of the present invention.
Figure 2B:
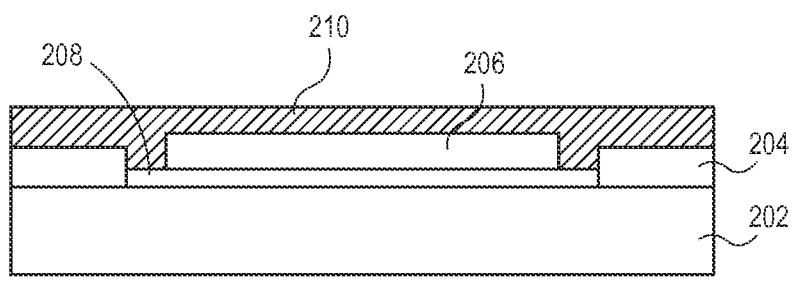

Another embodiment involves gently moisturizing (e.g., with water) the contact side of the water soluble dry film, which is described in detail below with respect to the Figures. FIGS. 1 and 2A-2B illustrate a method of forming a water soluble mask by dry film lamination, according to embodiments of the invention. FIGS. 5 and 6A-6C illustrate a method of wafer dicing including formation of a water soluble mask by dry lamination.

Turning to FIG. 1 and to corresponding FIGS. 2A-2B, the dry lamination method 100 involves forming a mask over a semiconductor wafer 206 that is coupled to a frame 204 with adhesive tape 208. The semiconductor wafer 206 is supported over a stage 202 in a chamber. In one embodiment, the semiconductor wafer 206 is supported in a vacuum chamber.

The method 100 begins at operation 102 with moisturizing (e.g., moistening) an inner area 212 of a water soluble dry film 210. In an embodiment, the water soluble dry film 210 includes a water soluble polymer. Many such polymers are commercially available for applications such as laundry and shopping bags, green packaging, etc. However, selection of water soluble material for the present invention may be complicated by stringent demands on maximum film thickness, etch resistance, thermal stability, mechanics of applying and removing the material from the substrate, and microcontamination. Exemplary materials include, at least one of: poly (vinyl alcohol) (PVA), poly(acrylic acid), poly(methacrylic acid), poly(acrylamide), or poly(ethylene oxide) with many other water soluble materials also available. According to embodiments, the material of the water soluble dry film is more adhesive when it is wet than when it is dry. Thus, moisturizing an area of the water soluble dry film results in the moistened area becoming adhesive.

Figure 3B:
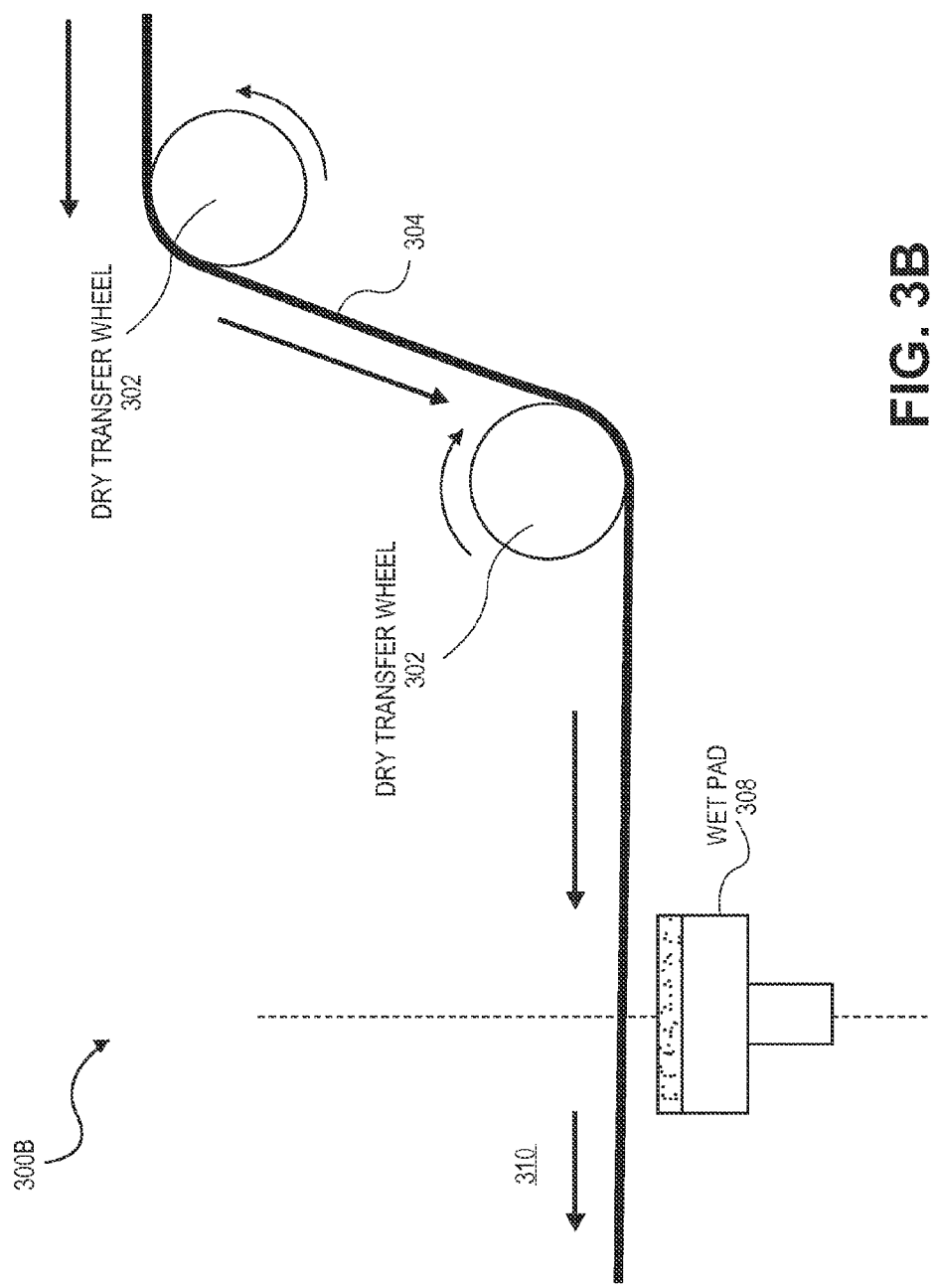
Figure 3C:
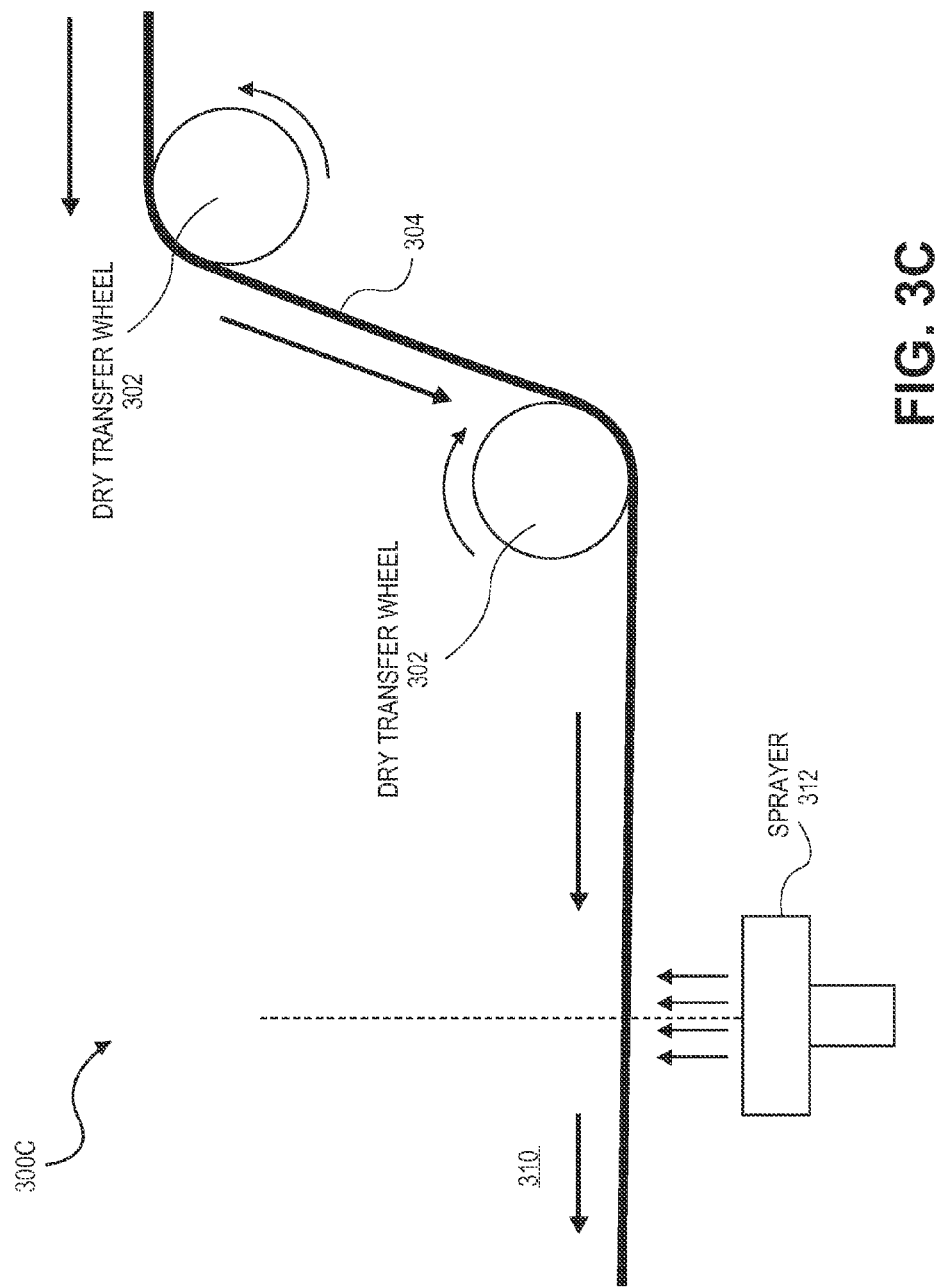

In the illustrated embodiment, the inner area 212 to be moisturized has a diameter, d, that is greater than the diameter of the outer edges of the semiconductor wafer 206 over which the film is to be attached. Although the illustrated embodiment shows the moistened inner area 212 as having a diameter (suggesting the inner area 212 is circular), embodiments may involve moisturizing areas having non-circular shapes or forms. For example, the method may involve moisturizing a rectangular area (or other polygonal area) having a width or length that is greater than an outer diameter of the semiconductor wafer 206. FIGS. 3A-3C, which are described below in more detail, illustrate examples of techniques for moisturizing a water soluble dry film.

At operation 104, the method 100 involves stretching the water soluble dry film 210 over a surface 207 of the semiconductor wafer 206. The method 100 may also involve heating the water soluble dry film 210. Methods that include heating the water soluble dry film 210 may involve indirectly heating the film 210 by heating the stage 202 over which the semiconductor wafer 206 is disposed. For example, in one embodiment, the stage 202 is heated in a vacuum chamber to a predetermined temperature (e.g., <90° C.). Embodiments involving heating of the dry film 210 may improve the quality of the applied film. Other embodiments may involve other techniques for heating the water soluble dry film 210, or may not involve heating the water soluble dry film 210. The method 100 then involves attaching the moistened inner area 212 of the stretched film 210 to the surface 207 of the semiconductor wafer 206, at operation 106. The moistened area adheres strongly to the surface 207 of the semiconductor wafer 206.

Depending on the diameter and shape of the moistened inner area 212, the moistened inner area 212 may be attached to one or more of the surface 207 of the semiconductor wafer 206, the tape 208, and the frame 204. In one embodiment, attaching the moistened inner area of the stretched film may involve attaching the moistened inner area to roughly the entire top surface 207 of the semiconductor wafer 206, and some or all areas of the adhesive tape 208 exposed between the semiconductor wafer 206 and the frame 204. In some embodiments, attaching the moistened inner area 212 of the film 210 may further involve attaching the moistened inner area 212 to at least an inner portion of the frame 204. Although the moistened inner area 212 may be attached to the entire top surface of the frame 204, attaching the moistened inner area to only an inner portion of the frame 204 may result in easier mask removal. For example, in one embodiment, the moistened inner area 212 of the water soluble dry film 210 is attached to the inner 50% or less of the frame 204. In other embodiments, the water soluble dry film 210 is attached to the inner 80% or less of the frame 204. In embodiments in which the diameter of the moistened area 212 of the water soluble dry film 210 is smaller than the outer diameter of the frame 204, the method may involve attaching a dry outer area of the stretched film 210 to the frame 204. After attaching the water soluble dry film 210, the film 210 may be cut (e.g., along the frame 204).

Referring again to the operation 102 of the method 100, FIGS. 3A-3C illustrate examples of techniques for moisturizing the inner area of a water soluble dry film. FIG. 3A illustrates a cross-sectional view of a dry lamination tool 300A including a wet transfer wheel (e.g., roller) 306, in accordance with embodiments of the present invention. The dry lamination tool 300A includes dry transfer wheels (e.g., dry rollers) 302 configured to transfer a water soluble dry film 304 from a film source to a chamber (e.g., vacuum chamber) 310. The wet transfer wheel 306 is configured to both transfer the dry film 304 to the chamber 310 and moisturize an inner area of the film 304. According to one embodiment, the size of the moisturized inner area of the film depends on the width of the moisturizing surface of the wet transfer wheel 306.

Figure 4A:
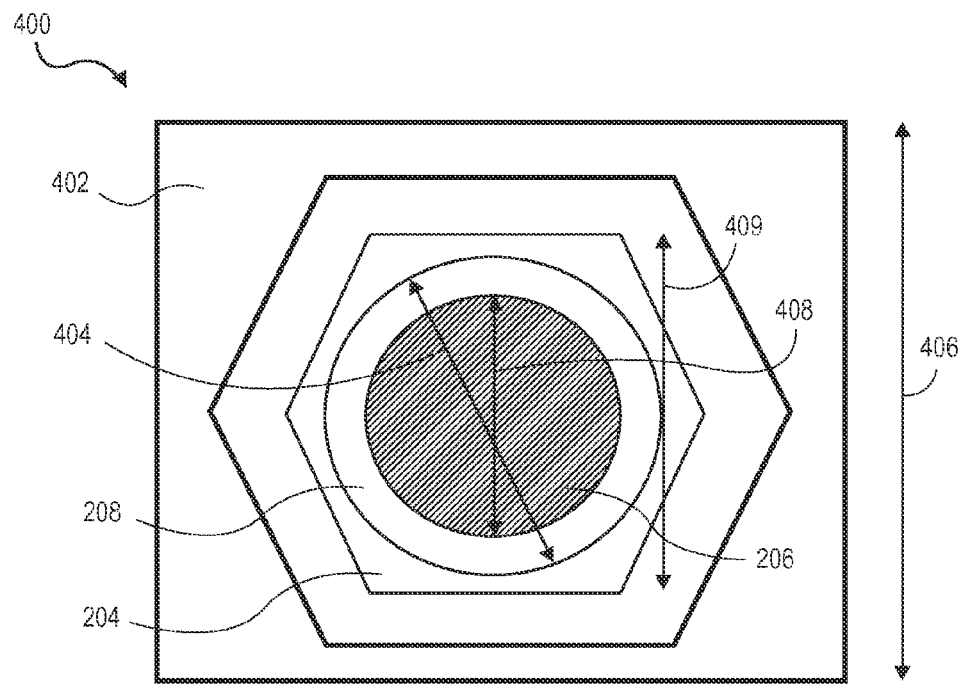
FIG. 4A is a plan view of a dry lamination tool, in accordance with an embodiment of the present invention.
Figure 4B:
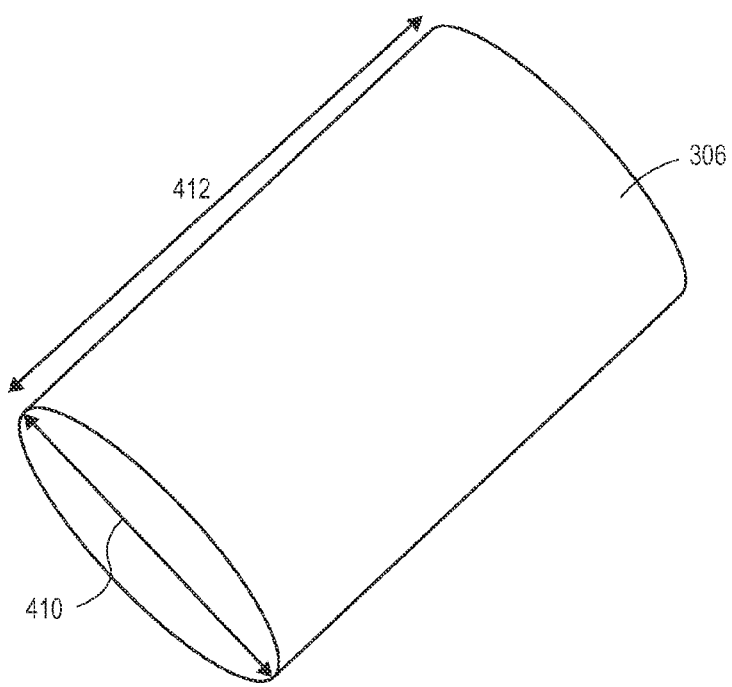
FIG. 4B is an isometric view of a wet transfer wheel in a dry lamination tool, in accordance with an embodiment of the present invention.

For reference, FIGS. 4A and 4B illustrate a dry lamination tool 400 and a wet transfer wheel 306, in accordance with embodiments of the invention. As illustrated in FIG. 4A, a semiconductor wafer 206 is supported over and coupled with a frame 204 with adhesive tape 208. The framed wafer 206 is supported in a vacuum chamber 402 having a width 406. As a dry film is transferred into the chamber 402, a moisture applicator moisturizes a portion of the dry film. In an embodiment where the moisture applicator is a wet transfer wheel (as in FIG. 3A), the wet transfer wheel has a diameter 410 and a width (length) 412. In the example illustrated in FIG. 4B, the entire width 412 of the wet transfer wheel 306 is assumed to have a moisturizing surface. However, in other embodiments, only a portion of the wet transfer wheel 306 may have a moisturizing surface. Referring to FIGS. 4A and 4B, in one embodiment, the width 412 of the wet transfer wheel 306 is greater than or equal to a diameter 408 of the semiconductor wafer 206, and less than or equal to an outer diameter 409 of the frame 204. Thus, in one such embodiment, the wet transfer wheel 306 would moisturize an area of the water soluble dry film to contact at least the surface of the surface of the semiconductor wafer 206. In some embodiments, the wet transfer wheel 306 would also moisturize an area of the water soluble dry film to contact the wafer frame 204 supporting the semiconductor wafer 206 and the adhesive tape 208 used to couple the wafer 206 to the frame 204. For example, in one embodiment, the width 412 of the moisturizing surface of the wet transfer wheel 306 is greater than or equal to an inner diameter 404 of the frame 204. After moisturizing at least the inner area of the water soluble dry film, the film is applied to the surface of the semiconductor wafer.

In another embodiment, moisturizing an inner area of the water soluble dry film involves pressing the water soluble dry film with a wet pad. For example, FIG. 3B illustrates a cross-sectional view of a dry lamination tool 300B including a wet pad 308, in accordance with embodiments of the present invention. Similar to the dry lamination tool 300A illustrated in FIG. 3A, the dry lamination tool 300B includes dry transfer wheels 302 configured to transfer a water soluble dry film 304 from a film source to a chamber 310. Instead of the wet transfer wheel 306 of the dry lamination tool 300A, the dry lamination tool 300B in FIG. 3B includes a wet pad 308, which may be pressed against the film 304 to moisturize an inner area of the film 304.

The wet pad 308 may have dimensions and a shape to moisturize a desired area of the water soluble dry film. For example, referring again to FIG. 4A, in one embodiment, the wet pad 308 has a width that is greater than or equal to a diameter 408 of the semiconductor wafer 206 and less than or equal to an outer diameter 409 of the frame 204. According to one embodiment, the width of the wet pad 308 is greater than or equal to an inner diameter 404 of the frame 204. The shape of the wet pad may be, for example, circular, polygonal, or any other shape configured to moisturize a desired inner area of the water soluble dry film. In an embodiment using a non-circular frame (such as the frame 204 illustrated in FIG. 4A), the shape of the wet pad 308 may be similar to the shape of the non-circular frame 204. Such an embodiment can enable moisturizing an inner area of the film in such a way to leave a dry outer film border to be attached to the frame 204 along the entire perimeter of the frame 204. The material used in the wet pad 308 and the wet transfer wheel 306 may include an absorbent material (e.g., fabric, a sponge, etc.) to transfer moisture to the film when pressure is applied.

In another embodiment, moisturizing the inner area of the water soluble dry film involves spraying the inner area with water from sprayer. For example, FIG. 3C illustrates a cross-sectional view of a dry lamination tool 300C including a sprayer 312, in accordance with embodiments of the present invention. Similar to the dry lamination tools 300A and 300B illustrated in FIGS. 3A and 3B, the dry lamination tool 300C includes dry transfer wheels 302 configured to transfer a water soluble dry film 304 from a film source to a chamber 310. Prior to transferring the water soluble film 304 to the chamber 310, water from the sprayer 312 moisturizes an inner area of the film 304. The sprayer may include a plurality of nozzles from which small water droplets are directed onto the film 304. The number, configuration, and size of nozzles of the sprayer 312 may result in moisturizing areas having various shapes. For example, the sprayer 312 may be configured to form an approximately round or polygonal moistened area on the film 304. Referring to FIG. 4A, the length of the sprayer 312 may be greater than or equal to a diameter 408 of the semiconductor wafer 206 and less than or equal to an outer diameter 409 of the frame 204. In one embodiment, the length of the sprayer is greater than or equal to an inner diameter 404 of the frame 204.

Referring again to FIG. 2A, in one embodiment, the water soluble film 210 to be formed over the wafer is thin. For example, in one embodiment, the water soluble film has a thickness of 5 to 15 μm. Such thin films may not be able to withstand dry lamination techniques involving heating and/or stretching the film 210 without breaking. Therefore, according to embodiments involving thin water soluble dry films, prior to lamination, the thin water soluble dry film is adhered to a carrier (such as an adhesive tape). The carrier may be releasable by thermal or UV curing. The compound tape (including the water soluble dry film and the adhesive tape) is then moisturized (e.g., according to operation 102 of FIG. 1) and attached onto the wafer surface via vacuum lamination. The adhesive tape may then be released.

For example, in one embodiment, adhering adhesive tape to the water soluble dry film involves adhering a release layer of the adhesive tape to a first side of the water soluble dry film. The opposite side of the water soluble dry film may then be moisturized (e.g., in accordance with techniques described above) and attached to the surface of the semiconductor wafer. After attaching the moistened inner area of the film to the surface of the semiconductor wafer, the adhesive tape can be removed by releasing the release layer. In an embodiment using UV-curable adhesive tape, releasing the release layer involves irradiating the adhesive tape with UV radiation. In an embodiment using thermally curable adhesive tape, releasing the release layer may involve heating the adhesive tape.

Methods of forming water soluble films via dry lamination, such as the method described in FIG. 1, may be used in a variety of wafer processing operations, including in a wafer dicing process. When dicing wafers that are 300 μm or thicker, the wafers are rigid enough to be directly placed on mounting tapes without die attach film (DAF). In circumstances where wafers are placed on mounting tapes without DAF, no DAF cutting process is involved. Embodiments described herein address the dicing applications of integrated circuit (IC) wafers (e.g., integrated wafers with processor chips) that have a thickness of 250 μm to 800 μm. Furthermore, embodiments address dicing applications of integrated circuit wafers with an acceptable dicing kerf width of 50 μm to 200 μm width, preferably 50 μm to 100 μm measured on the wafer front surface. A kerf width of 50 μm to 100 μm measured on the wafer front surface corresponds to a typical kerf width measured from the back side of the wafer of 30-50 μm in a laser/saw hybrid process.

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. Thus, in one embodiment, a method uses a hybrid approach employing laser scribing and plasma etching to dice the wafers. The laser scribing removes difficult-to-etch passivation layers, dielectric layers, and metal layers until the underlying silicon substrate is exposed. Plasma etching generates trenches of a depth to the target die thickness. In another embodiment, the laser etch process may involve ablating, with the laser scribing process, the entire thickness of the substrate, followed by plasma etching the substrate surfaces exposed by the laser scribing process. In one such embodiment, the plasma etching may remove semiconductor damaged by the laser ablation to improve die strength.

Thus, according to embodiments, the proposed approaches use both laser scribing and plasma etching instead of only laser scribing or blade sawing to generate trenches in a semiconductor wafer. Embodiments involve forming a water soluble mask layer over the semiconductor wafer to protect the integrated circuits (and in some embodiments, to protect bumps or pads) from being exposed during laser scribing and/or plasma etching.

Figure 5:
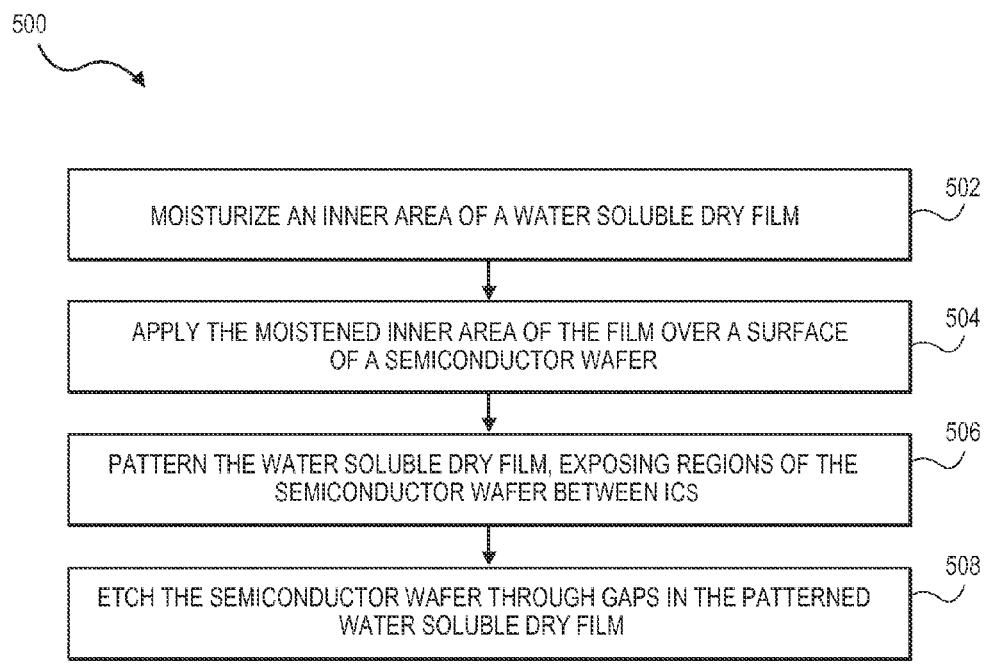
FIG. 5 is a flowchart representing operations in a method of dicing a semiconductor wafer including a plurality of integrated circuits, in accordance with an embodiment of the present invention.

FIG. 5 is a flowchart representing operations in methods of dicing a semiconductor wafer including a plurality of integrated circuits, in accordance with embodiments of the present invention. FIGS. 6A, 6B, 6C, 6D, 6E, 6F, and 6G illustrate cross-sectional views of a semiconductor wafer including a plurality of integrated circuits during performance of a method of dicing the semiconductor wafer, corresponding to operations of FIG. 5, in accordance with embodiments of the present invention.

Figure 6A:
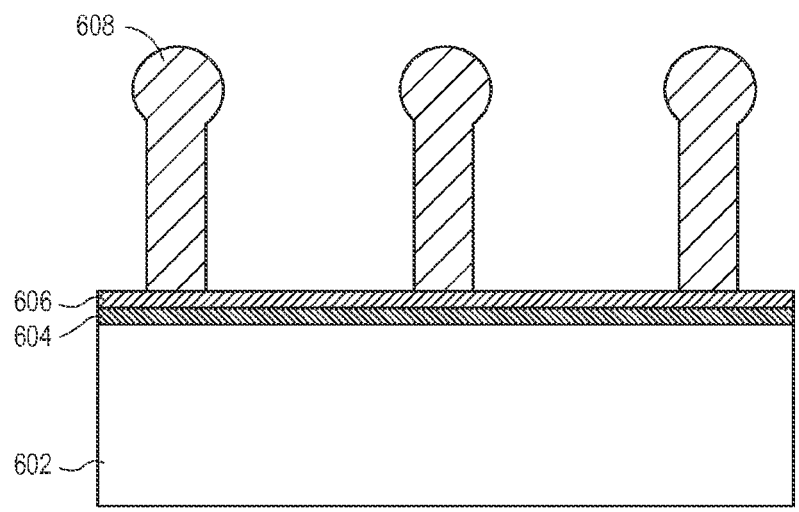
FIGS. 6A, 6B, 6C, 6D, 6E, 6F, and 6G illustrate cross-sectional views of a semiconductor wafer including a plurality of integrated circuits during performance of a method of dicing the semiconductor wafer, corresponding to operations of FIG. 5, in accordance with embodiments of the present invention.
Figure 7:
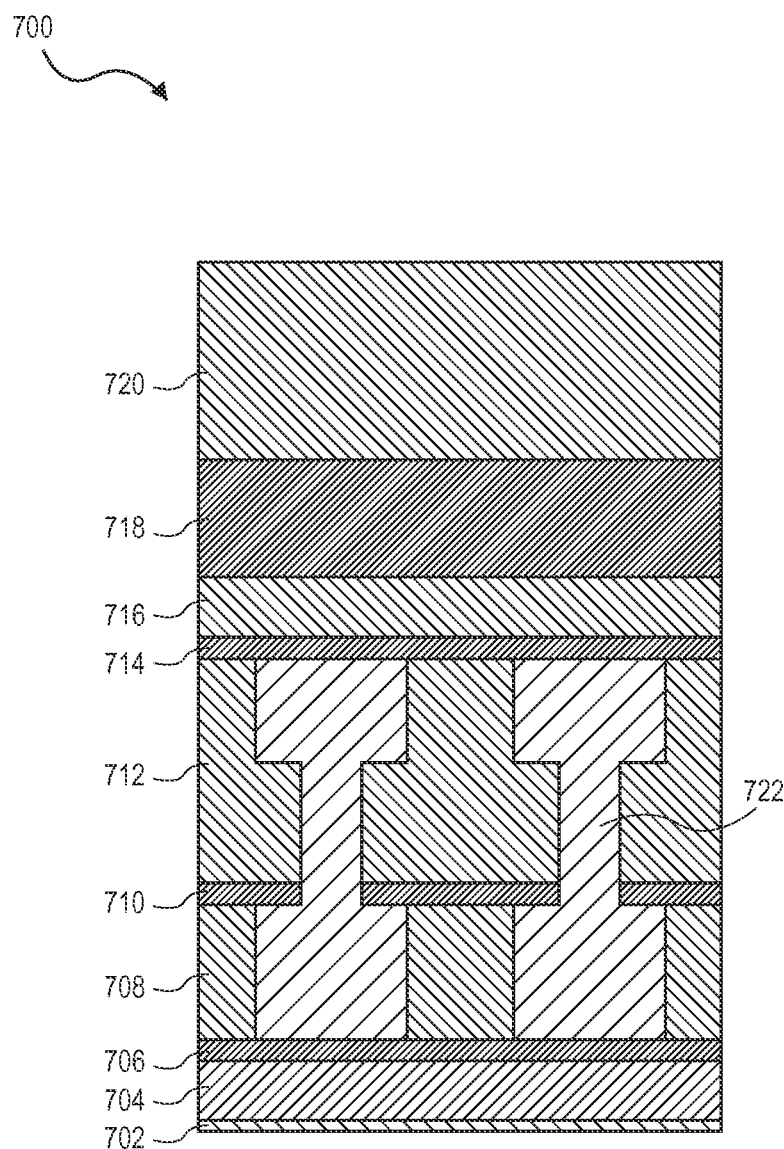
FIG. 7 illustrates a cross-sectional view of a stack of materials that may be present in a street region of a semiconductor wafer or substrate, in accordance with embodiments of the present invention.

Turning to FIG. 5, the dicing method 500 is performed on a semiconductor wafer or substrate with a plurality of integrated circuits (ICs). FIG. 6A illustrates a cross-sectional view of an exemplary semiconductor wafer. According to one embodiment, the semiconductor wafer or substrate 602 has a diameter of at least 300 mm and has a thickness of 250 μm to 800 μm. The semiconductor wafer or substrate 602 has disposed thereon or therein, as a portion of integrated circuits 604, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps or pads 608 and passivation layers 606 may be formed above the interconnect layers. The conductive bumps or pads 608 may include solder balls. According to some embodiments, the conductive bumps or pads 608 are approximately 50 μm or taller. However, the embodiments described herein may also be used for dicing integrated circuits with conductive bumps or pads that are shorter than 50 μm. Materials making up the streets may be similar to or the same as those materials used to form the integrated circuits. For example, streets may be composed of layers of dielectric materials, semiconductor materials, and metallization. In one embodiment, one or more of the streets includes test devices similar to the actual devices of the integrated circuits. FIG. 7 and the corresponding description below describes the streets in further detail.

Figure 6B:
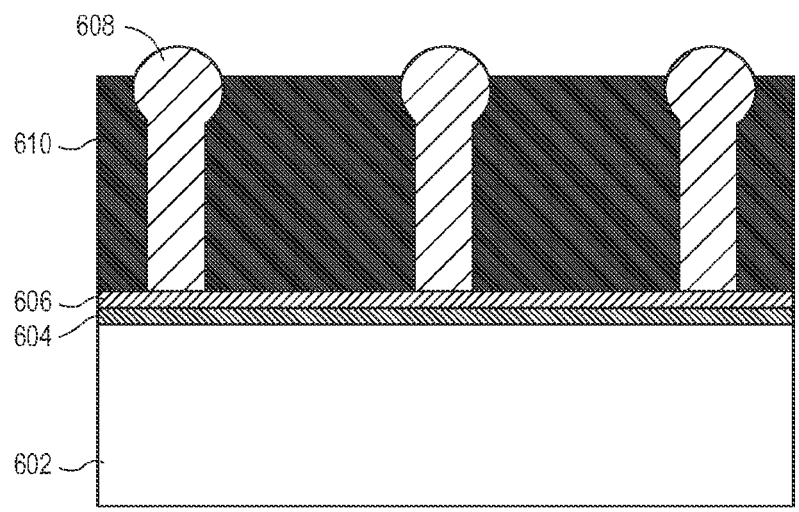

As illustrated in FIG. 6B, in one embodiment, the method includes forming an underfill layer 610 over the semiconductor wafer or substrate 602. The underfill layer 610 partially covers the bumps or pads 608 disposed over the semiconductor wafer or substrate 602. For example, in one embodiment, 5-10 μm of the bumps or pads 608 are exposed above the underfill layer 610. The embodiment illustrated in FIG. 6B is an example of a wafer-level underfill technique in which the underfill layer 610 is formed over the semiconductor wafer or substrate 602 prior to dicing, in contrast to conventional post-dicing underfill application. In conventional post-dicing underfill application, a liquid underfill capillary wetting and curing approach is typically used to form a solid underfill layer between dies. However, such a method may result in packaging yield loss and stacked die reliability issues, especially as the number of stacked dies increases for three-dimensional (3D) semiconductor die packaging applications.

According to embodiments, the underfill layer 610 may be a dry underfill film that is formed over the semiconductor wafer or substrate 602 with a dry lamination process, followed by wafer dicing as described below to singulate the dies. Each of the singulated dies would bear a dry underfill film over it, eliminating the need for post-dicing underfill application, and therefore preventing the packaging yield loss and reliability issues associated with some post-dicing underfill techniques. The dies can then be stacked to form 3D packages. In one embodiment, the dry underfill film is thermally conductive, electrically insulating, and provides mechanical support to each die. Thus, in embodiments, the underfill layer 610 enables more rigid dies and reduces the risk of die warpage. Other embodiments do not involve formation of an initial dry underfill layer 610.

Figure 6C:
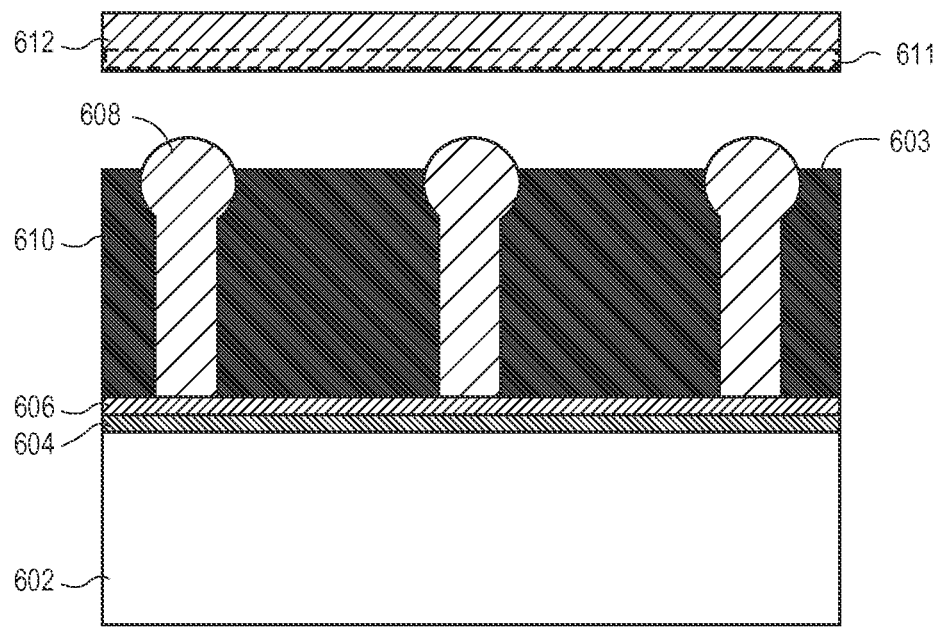

Returning to FIG. 5 and to corresponding FIG. 6C, the method 500 involves moisturizing an inner area 611 of a water soluble dry film 612, at operation 502. Moisturizing the inner area 611 of the water soluble dry film 612 at operation 502 may be the same or similar to the operation 102 of FIG. 1.

In one embodiment, the water soluble dry film 612 is to be of sufficient thickness to survive the subsequent plasma etch process, protecting even the bumps or pads 608 which, typically being copper, may be damaged, oxidized, or otherwise contaminated if exposed to an etchant plasma. In another embodiment, the bumps or pads 608 may be exposed during plasma etching. The minimum thickness of the water soluble dry film 612 is a function of the selectivity achieved by the subsequent plasma etch (e.g., operation 508 of FIG. 5). The plasma etch selectivity is dependent on at least both the material/composition of the water soluble layer and the etch process employed. Generally, where the plasma utilized has relatively low ion bombardment energy, etch selectivity over the mask material is improved, allowing for a thinner water soluble dry film. In one embodiment, the water soluble dry film has a thickness in a range of 5 to 15 μm.

Figure 6D:
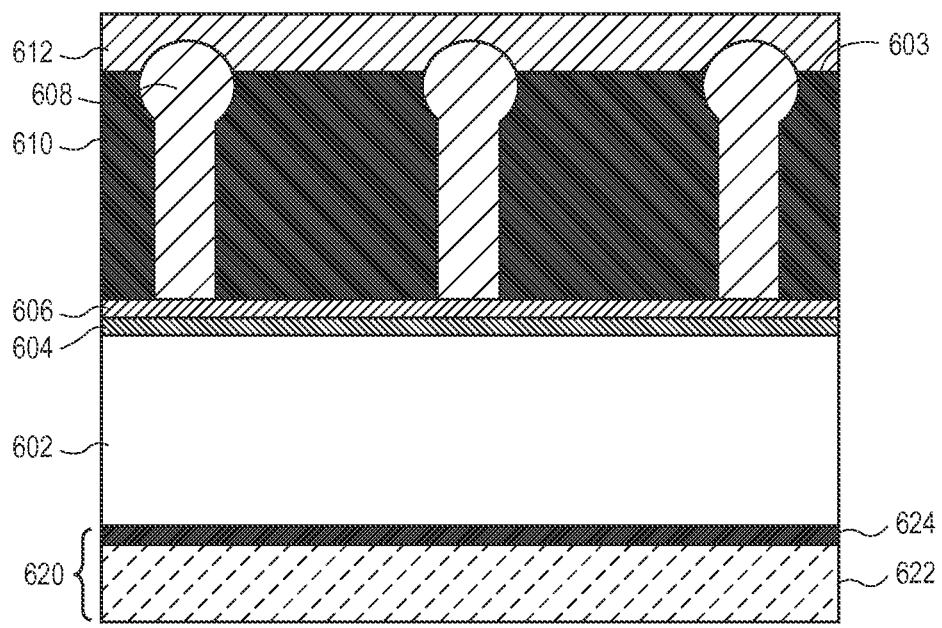

After moisturizing the inner area 611 of the water soluble dry film 612, the method 500 involves applying the moistened inner area 611 of the water soluble dry film 612 over a surface of the semiconductor wafer or substrate 602 at operation 504, and corresponding to FIG. 6D. In the illustrated embodiment, the water soluble dry film 612 forms a mask that covers and protects integrated circuits (ICs) formed over the surface of semiconductor wafer and also protects the bumps or pads 608 projecting or protruding up from the surface of the semiconductor wafer. The water soluble dry film 612 also covers intervening streets formed between adjacent ones of the integrated circuits.

As discussed above with reference to FIG. 1, applying the water soluble dry film to the surface of the semiconductor wafer may involve heating the water soluble dry film, stretching the heated water soluble dry film, and attaching the stretched water soluble dry film to the surface of the semiconductor wafer.

Figure 6E:
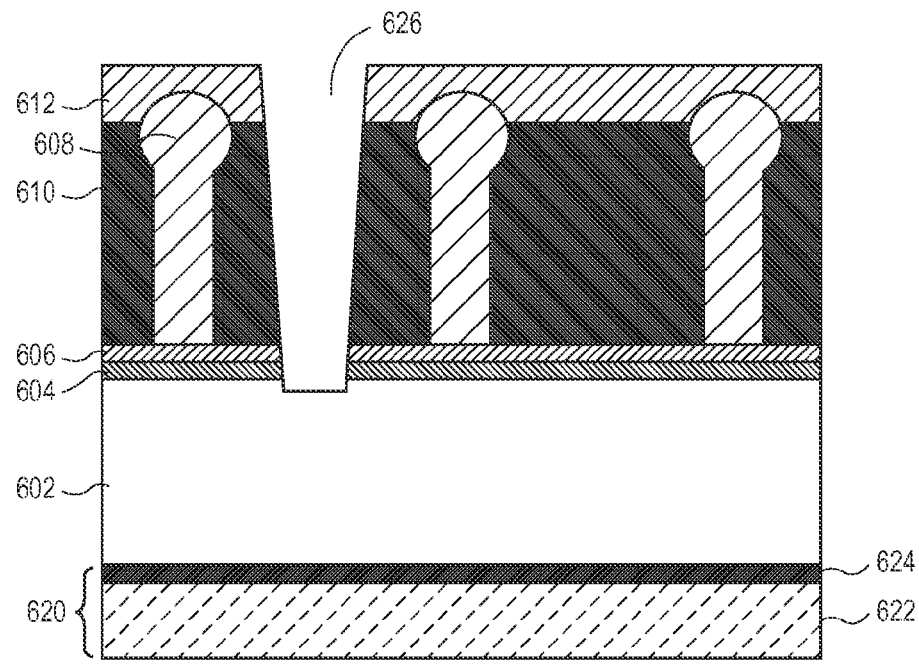

The method 500 also involves patterning the water soluble dry film 612 at operation 506, as illustrated in FIG. 6E. For example, the method 500 may involve laser scribing or another technique for patterning the water soluble dry film 612. The laser scribing process exposes regions 626 (e.g., gaps or trenches) of the semiconductor wafer between the ICs. In an embodiment involving laser-scribing, a femtosecond laser may be preferred to minimize dielectric delamination and cracking. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

The laser scribing process is performed generally to remove the material of the streets present between the integrated circuits. In accordance with an embodiment of the present invention, patterning the water soluble dry film 612 with the laser scribing process includes forming trenches 626 partially into the regions of the semiconductor wafer between the integrated circuits. In an embodiment, patterning the mask 612 with the laser scribing process includes direct writing a pattern using a laser having a pulse width in the femtosecond range. Specifically, a laser with a wavelength in the visible spectrum (e.g., green band, or 500-540 nm) or the ultra-violet (UV, or 300-400 nm band) or infra-red (IR) band (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask, the streets and, possibly, a portion of the semiconductor wafer or substrate.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed over a wafer or substrate may include the similar or same layers as the integrated circuits themselves. For example, FIG. 7 illustrates a cross-sectional view of a stack of materials that may be used in a street region of a semiconductor wafer or substrate, in accordance with an embodiment of the present invention. Referring to FIG. 7, a street region 700 includes the top portion 702 of a silicon substrate, a first silicon dioxide layer 704, a first etch stop layer 706, a first low K dielectric layer 708 (e.g., having a dielectric constant of less than the dielectric constant of 4.0 for silicon dioxide), a second etch stop layer 710, a second low K dielectric layer 712, a third etch stop layer 714, an undoped silica glass (USG) layer 716, a second silicon dioxide layer 718, and a layer of photo-resist 720 or some other mask. Copper metallization 722 is disposed between the first and third etch stop layers 706 and 714 and through the second etch stop layer 710. In a specific embodiment, the first, second and third etch stop layers 706, 710 and 714 are composed of silicon nitride, while low K dielectric layers 708 and 712 are composed of a carbon-doped silicon oxide material.

Under conventional laser irradiation (such as nanosecond-based or picosecond-based laser irradiation), the materials of street 700 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In another embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in a single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to (e.g., 500-540 nm), or in the UV range (e.g., 300-400 nm) provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 6F:
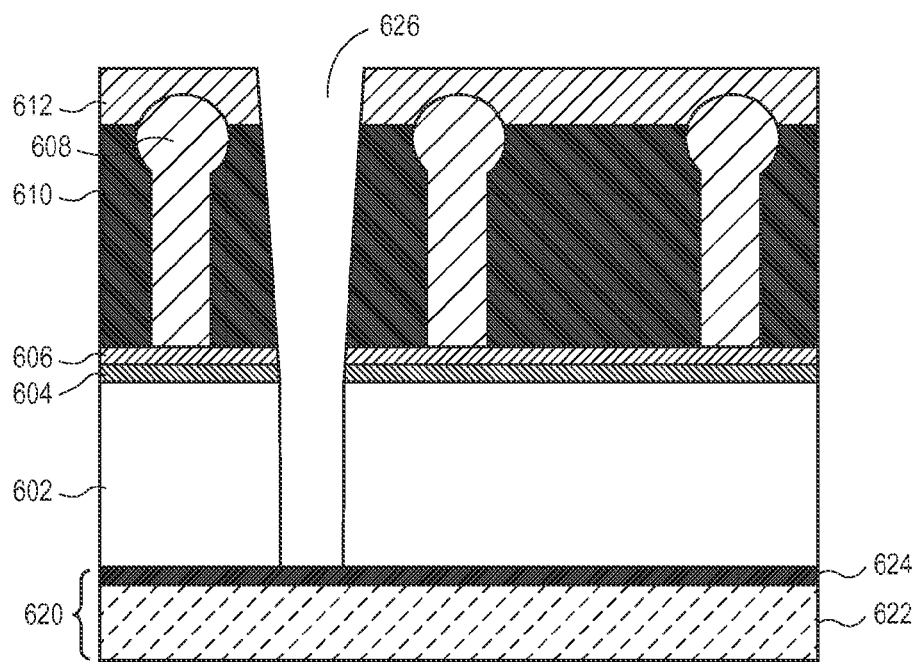

Returning to FIG. 5 and to corresponding FIG. 6F, in some embodiments, singulation of the dies is done by etching (e.g., plasma etching) after the initial patterning operation. For example, the method 500 includes etching the semiconductor wafer through gaps in the patterned water soluble dry film, which may ultimately etch entirely through semiconductor wafer, at operation 508. In the exemplary embodiments illustrated by FIG. 6F, the plasma etching is stopped on the dicing tape 620, with individualized portions of the semiconductor wafer or substrate 602 separated by trench 626. In one embodiment, the dicing tape 620 may include, for example, a base material 622 and a release layer 624

In a specific embodiment involving plasma etching, during the etch process the etch rate of the material of semiconductor wafer or substrate 602 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used, at least in theory, for example, if throughput is not of paramount importance.

In an exemplary embodiment, a deep silicon etch is used to etch a single crystalline silicon substrate or wafer 602 at an etch rate greater than approximately 40% of conventional silicon etch rates (e.g., 40 µm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $NF_3$, $SF_6$, $SiF_4$, $C_4F_8$, $CHF_3$, $XeF_2$, or any other reactant gas capable of etching silicon at a relatively fast etch rate.

In another embodiment, the laser scribing process singulates the dies, and a plasma etching operation may be performed to remove damaged semiconductor material resulting from the laser scribing process. For example, a plasma etch operation may remove a portion of semiconductor from the sidewalls of the scribed trenches. According to embodiments, the singulated dies need sufficiently high die break strengths to ensure reliable die pick and place and subsequent assembly processes. It has been found that the rough, damaged sidewalls present following the laser ablation operation may unacceptably reduce die break strength. However, it has also been found that the damage layer in a silicon substrate for a femtosecond laser is less than 3 µm thick and that a higher die break strength can be achieved by performing the plasma etch operation to remove a comparable thickness of semiconductor from sidewalls exposed by the trench 626.

Vertical etch rates of 10 µm/min are expected with lateral etch rate being between 50 and 100% of that, depending on process conditions. As such, etch time is generally within 10 to 90 sec, depending on the desired undercut and/or remaining thickness of the substrate.

Figure 6G:
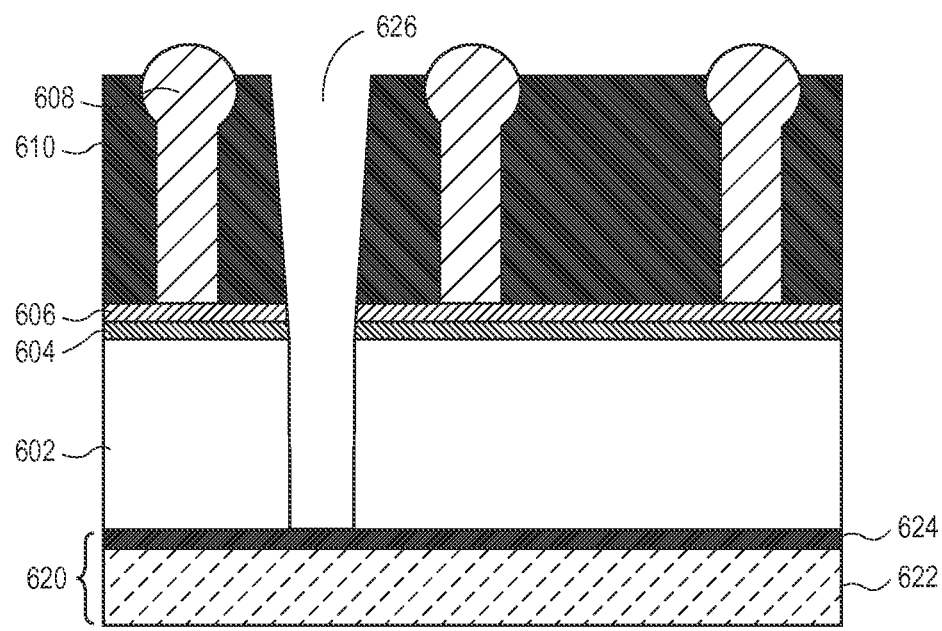

After etching at operations 508, the method may involve removing the water soluble dry film 612, as illustrated in FIG. 6G. Removing the water soluble dry film 612 may involve pressurized water jets, a water bath, or other water soluble film removal methods.

Thus, FIG. 5 depicts a method of dicing a semiconductor wafer or substrate involving application of a water soluble film via dry lamination techniques. In contrast to existing methods involving spin-coating techniques to apply water soluble masks, the methods 100 of FIG. 1 and 500 of FIG. 5 involve applying a moistened water soluble dry film with a dry lamination process. Applying the water soluble dry film with a dry lamination process as described above can reduce voids or air bubbles in the mask that occur during spin-coating, while also preventing unwanted peeling of the mask layer.

Figure 8:
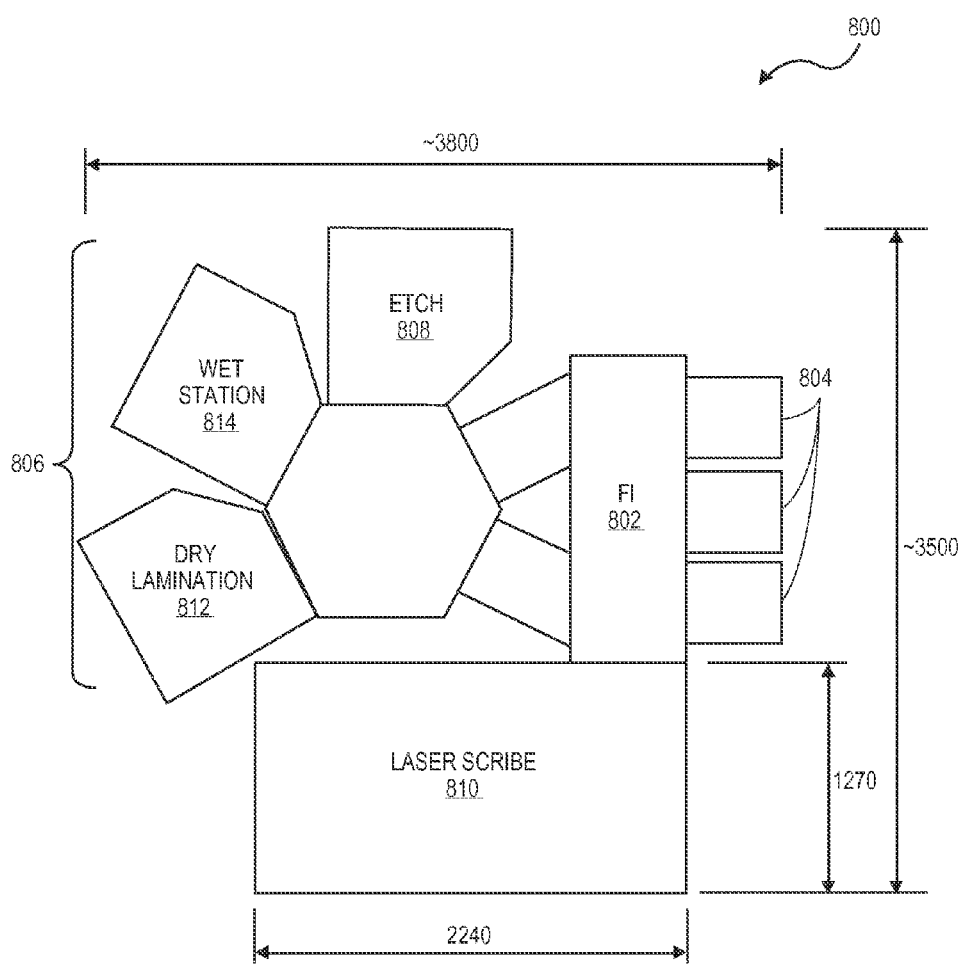
FIG. 8 illustrates a block diagram of a tool layout for dicing semiconductor wafers, in accordance with an embodiment of the present invention.

Turning to FIG. 8, a single integrated platform 800 may be configured to perform many or all of the operations in the hybrid laser ablation-plasma etch singulation process 500 of FIG. 5. For example, FIG. 8 illustrates a block diagram of a cluster tool 806 coupled with laser scribe apparatus 810 for laser and plasma dicing of substrates, in accordance with an embodiment of the present invention. Referring to FIG. 8, the cluster tool 806 is coupled to a factory interface 802 (FI) having a plurality of load locks 804. The factory interface 802 may be a suitable atmospheric port to interface between an outside manufacturing facility with laser scribe apparatus 810 and cluster tool 806. The factory interface 802 may include robots with arms or blades for transferring substrates (or carriers thereof) from storage units (such as front opening unified pods) into either cluster tool 806 or laser scribe apparatus 810, or both.

A laser scribe apparatus 810 is also coupled to the FI 802. In an embodiment, the laser scribe apparatus 810 includes a femtosecond laser operating in the 300-540 nm band. The femtosecond laser may be configured to perform the laser ablation portion of the hybrid laser and etch singulation process 500 of FIG. 5. In one embodiment, a moveable stage is also included in the laser scribe apparatus 810, the moveable stage configured for moving a wafer or substrate (or a carrier thereof) relative to the femtosecond-based laser. In a specific embodiment, the femtosecond laser is also moveable.

The cluster tool 806 includes one or more plasma etch chambers 808 coupled to the FI by a robotic transfer chamber housing a robotic arm for in-vaccuo transfer of substrates. The plasma etch chambers 808 is suitable for performing a plasma etch portion of the hybrid laser and etch singulation process 500. In one exemplary embodiment, the plasma etch chamber 808 is further coupled to an $SF_6$ gas source and at least one of a $C_4F_8$ and $C_4F_6$ source. In one embodiment, the plasma etch chamber 808 is coupled to an $SF_6$ gas source and at least one of a $C_4F_8$, $CF_4$, and $C_4F_6$ source. In a specific embodiment, the one or more plasma etch chambers 808 is an Applied Centura® Silvia™ Etch system, available from Applied Materials of Sunnyvale, Calif., USA, although other suitable etch systems are also available commercially. In an embodiment, more than one etch chamber 808 is included in the cluster tool 806 portion of integrated platform 800 to enable high manufacturing throughput of the singulation or dicing process.

Other chambers or stations suitable for performing functions described herein may be a part of the cluster tool 806, or separate from the cluster tool 806. For example, the illustrated cluster tool 806 includes a dry lamination module 812 and a wet station 814. According to other embodiments, the dry lamination module 812 and/or wet station are separate from the cluster tool 806. The dry lamination module 812 includes a moisture applicator configured to moisturize an inner area of the water soluble dry film. For example, the dry lamination module may include a wet transfer wheel, a wet pad, a sprayer, and/or other moisture applicator. The dry lamination module may include a film applicator configured to apply the moistened inner area of the film to a surface of the semiconductor wafer. The film applicator may include a heater configured to heat a film, and a stretching mechanism configured to stretch the heated film.

The dry lamination module 812 may also be configured to form an underfill layer over the semiconductor wafer or substrate. Thus, in one such embodiment, dicing tool costs may be reduced by applying both the wafer-level underfill and the dry film mask layer with the same tool. In other embodiments involving application of wafer-level underfill, a separate tool is used to apply the underfill and the water-soluble mask.

The wet station 814 may be configured to dissolve the water soluble dry film (e.g., after plasma etching the substrate). The wet station 814 may include, for example, a pressurized spray jet to dispense water other solvent. Although the wet station 814 is illustrated as integrated in the cluster tool 806, other embodiments may include a wet station that is physically separate from the cluster tool 806.

In one embodiment involving dry lamination of a thin water soluble film using a carrier tape, the dry lamination module 812 includes a tape applicator configured to adhere an adhesive tape to a thin dry film. In one such embodiment, the dry lamination module 812 may further include a curing module to release the adhesive tape from the thin dry film, for example, with UV radiation sources or heaters. The cluster tool may also include a controller (not shown in FIG. 8) to configure and/or control the modules to perform methods described herein. The controller may include, for example, elements of the computer system 900 of FIG. 9.

Figure 9:
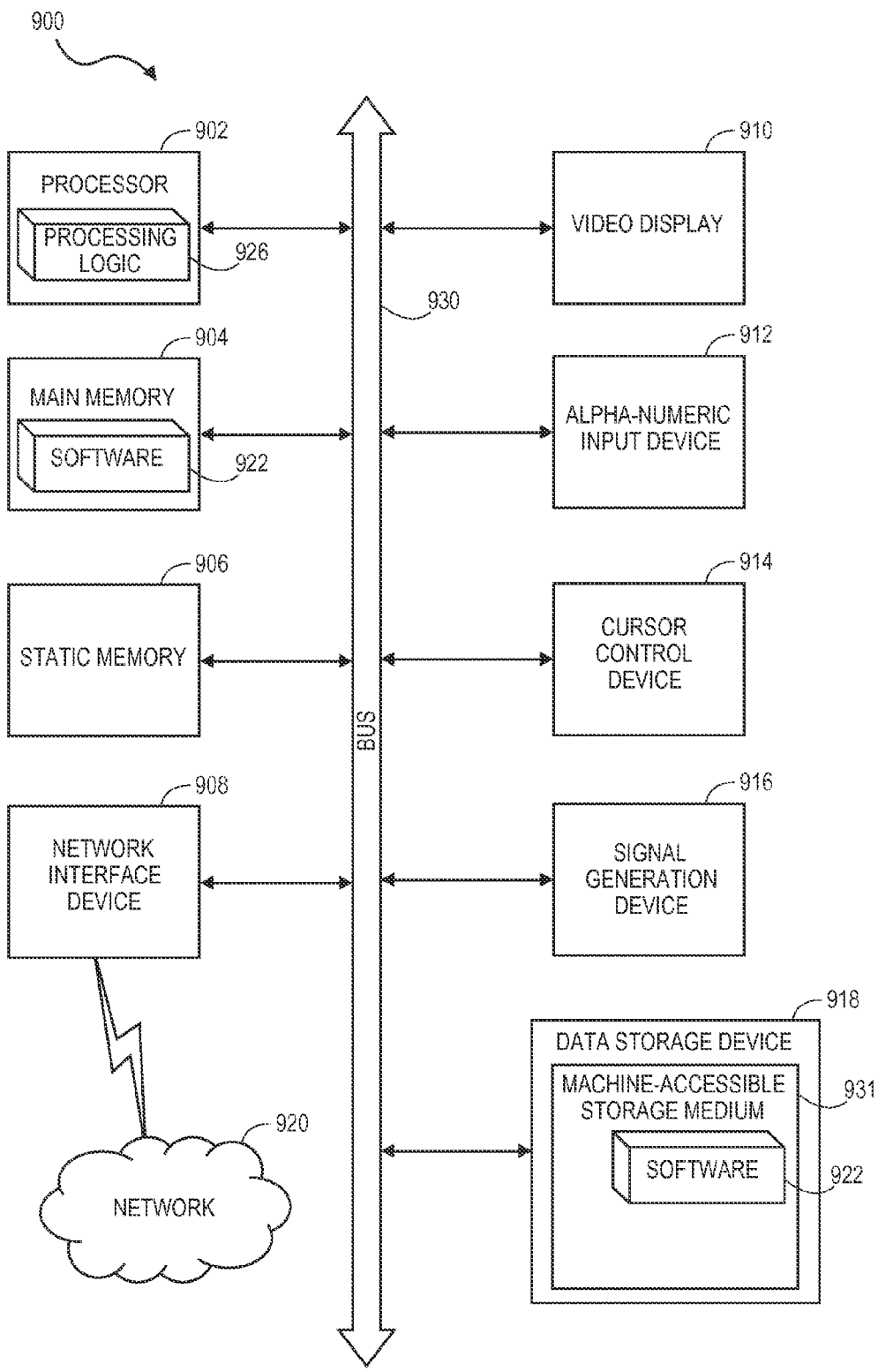
FIG. 9 illustrates a block diagram of an exemplary computer system which controls automated performance of one or more operations in the dry lamination and dicing methods described herein, in accordance with an embodiment of the present invention.

FIG. 9 illustrates a computer system 900 within which a set of instructions, for causing the machine to execute instructions to perform one or more of the mask formation or wafer dicing methods discussed herein. The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, etc. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations and steps discussed herein.

The computer system 900 may further include a network interface device 908. The computer system 900 also may include a video display unit 910 (e.g., a liquid crystal display (LCD) or a cathode ray tube (CRT)), an alpha-numeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of forming a water soluble film over a semiconductor wafer, the method comprising:
    moisturizing an inner area of a water soluble dry film;
    stretching the water soluble dry film over a surface of the semiconductor wafer; and
    attaching the moistened inner area of the stretched film to the surface of the semiconductor wafer.

2. The method of claim 1, wherein:
    wherein attaching the moistened inner area of the stretched film comprises attaching the moistened inner area to adhesive tape exposed between the semiconductor wafer and a frame supporting the semiconductor wafer.

3. The method of claim 2, wherein:
    wherein attaching the moistened inner area of the stretched film comprises attaching the moistened inner area to at least an inner portion of the frame.

4. The method of claim 1, further comprising attaching a dry outer area of the stretched film to a frame supporting the semiconductor wafer.

5. The method of claim 1, wherein moisturizing the inner area of the water soluble dry film comprises transferring the film to a lamination chamber using a wet transfer wheel.

6. The method of claim 5, wherein the wet transfer wheel has a moisturizing surface with a width that is greater than or equal to a diameter of the semiconductor wafer and less than or equal to an outer diameter of the frame.

7. The method of claim 6, wherein the width of the moisturizing surface of the wet transfer wheel is greater than or equal to an inner diameter of the frame.

8. The method of claim 1, wherein moisturizing the inner area of the water soluble dry film comprises pressing the water soluble dry film with a wet pad.

9. The method of claim 8, wherein the wet pad has a width that is greater than or equal to a diameter of the semiconductor wafer and less than or equal to an outer diameter of the frame.

10. The method of claim 9, wherein the width of the wet pad is greater than or equal to an inner diameter of the frame.

11. The method of claim 1, wherein moisturizing the inner area of the water soluble dry film comprises spraying the inner area with water from sprayer.

12. The method of claim 11, wherein the length of the sprayer is greater than or equal to a diameter of the semiconductor wafer and less than or equal to an outer diameter of the frame.

13. The method of claim 12, wherein the length of the sprayer is greater than or equal to an inner diameter of the frame.

14. The method of claim 1, further comprising:
    prior to attaching the moistened inner area of the stretched film to the surface of the semiconductor wafer, adhering an adhesive tape to the water soluble dry film.

15. The method of claim 14, further comprising:
    removing the adhesive tape from the water soluble dry film after attaching the moistened area of the stretched film to the surface of the semiconductor wafer.

16. A method of dicing a semiconductor wafer comprising a plurality of integrated circuits (ICs), the method comprising:
    moisturizing an inner area of a water soluble dry film;
    applying the moistened inner area of the film over a surface of the semiconductor wafer;
    patterning the water soluble dry film, exposing regions of the semiconductor wafer between the ICs;
    etching the semiconductor wafer through gaps in the patterned water soluble dry film.

17. The method of claim 16, further comprising:
    removing the water soluble dry film.

18. The method of claim 16, wherein applying the moistened inner area of the film over the surface of the semiconductor wafer comprises:
    stretching the water soluble dry film; and
    attaching the stretched water soluble dry film to the surface of the semiconductor wafer.

19. A dry lamination tool for forming a film over a semiconductor wafer, the dry lamination tool comprising:
    a stage configured to support the semiconductor wafer coupled to a frame in a vacuum chamber;
    rollers configured to transfer a water soluble dry film from a film source to the vacuum chamber;
    a moisture applicator configured to moisturize an inner area of the water soluble dry film; and
    a film applicator configured to apply the moistened inner area of the film to a surface of the semiconductor wafer.

20. The dry lamination tool of claim 19, wherein the moisture applicator comprises a wet transfer wheel configured to moisturize the inner area of the water soluble dry film while transferring the water soluble dry film to the vacuum chamber.

* * * * *